United States Patent
Kantor et al.

(10) Patent No.: US 11,421,975 B2
(45) Date of Patent: Aug. 23, 2022

(54) ABSOLUTE POSITION DETECTION SYSTEM HAVING A SINGLE-TRACK MAGNETIC CODE TAPE

(71) Applicant: Balluff GmbH, Neuhausen a.d.F. (DE)

(72) Inventors: Zoltan Kantor, Nemesvámos (HU); Attila Szabó, Iszkaszentgyörgy (HU); Kolos Károly, Aszófő (HU)

(73) Assignee: Balluff GmbH, Neuhausen a.d.F. (DE)

( * ) Notice: Subject to any disclaimer, the term of this patent is extended or adjusted under 35 U.S.C. 154(b) by 0 days.

(21) Appl. No.: 17/183,462

(22) Filed: Feb. 24, 2021

(65) Prior Publication Data
US 2021/0293522 A1 Sep. 23, 2021

(30) Foreign Application Priority Data
Mar. 17, 2020 (DE) ...................... 10 2020 107 230.9

(51) Int. Cl.
| | | |
|---|---|---|
| *G01R 33/02* | (2006.01) | |
| *G01B 7/30* | (2006.01) | |
| *G01D 5/245* | (2006.01) | |
| *G01B 7/02* | (2006.01) | |

(52) U.S. Cl.
CPC ............. *G01B 7/30* (2013.01); *G01B 7/023* (2013.01); *G01D 5/2455* (2013.01); *G01R 33/02* (2013.01)

(58) Field of Classification Search
CPC ...... G01R 33/06; G01R 33/063; G01R 33/00; G01R 33/0011; H01L 43/00; G01D 5/24; G01D 5/2497; G01D 5/34746; G01D 2205/40; G01D 5/2066; G01D 5/2086
See application file for complete search history.

(56) References Cited

U.S. PATENT DOCUMENTS

| | | | |
|---|---|---|---|
| 6,760,682 B1 * | 7/2004 | Schwabe | H03M 1/0685 324/207.17 |
| 7,148,817 B2 | 12/2006 | Mueller | |
| 2015/0069225 A1 * | 3/2015 | Kim | G01D 5/2455 250/231.1 |
| 2015/0115940 A1 | 4/2015 | Haible | |

FOREIGN PATENT DOCUMENTS

| | | |
|---|---|---|
| DE | 195 18 664 C1 | 5/1996 |
| DE | 197 29 312 A1 | 1/1999 |
| DE | 102 34 744 A1 | 2/2004 |
| DE | 10 2008 018 355 A1 | 10/2009 |
| DE | 10 2013 222 073 A1 | 4/2015 |

OTHER PUBLICATIONS

German Search Report dated Sep. 30, 2020 in German Application No. 10 2020 107 230.9 with English translation of relevant parts.

\* cited by examiner

*Primary Examiner* — Son T Le
(74) *Attorney, Agent, or Firm* — Collard & Roe, P.C.

(57) ABSTRACT

A sensor arrangement for an absolute measuring position detection system based on a magnetic code object has a substantially linear arrangement of magnetic field sensors, wherein a bit pattern encoded on a single-track magnetic code object having a uniform bit length is readable by the magnetic field sensors. In the case of a position detection system having the sensor arrangement, the values of magnetic bits are detected in the range of a detected bit sequence and the position of each 0→1 and 1→0 bit transition along a longitudinal axis of a code object is determined from the detected bit values.

8 Claims, 7 Drawing Sheets

ABSOLUTE POSITION DETECTION SYSTEM HAVING A SINGLE-TRACK MAGNETIC CODE TAPE

CROSS REFERENCE TO RELATED APPLICATIONS

Applicant claims priority under 35 U.S.C. § 119 of German Application No. 10 2020 107 230.9 filed Mar. 17, 2020, the disclosure of which is incorporated by reference.

BACKGROUND OF THE INVENTION

1. Field of the Invention

The invention relates to a sensor arrangement for an absolute measuring position detection system based on a magnetic code object, e.g., a magnetic code strip or a coded magnetic tape, and a corresponding position detection system.

2. Description of the Related Art

A method for determining the relative position or movement of a physically linear coded bit sequence as well as a corresponding sensor head having an arrangement of sensor elements for detecting corresponding physical parameters are known from DE 195 186 64 C1. The sensor head comprises two sensor elements per bit of the bit sequence.

Furthermore, the present applicant develops and markets on the one hand a magnetic tape position detection system having an incremental position sensor for detecting the exact position of a target object, e.g., a magnetic code strip, wherein two sensor elements detecting a magnetic field are arranged in a line in parallel to the magnetic code strips. The distance between these sensor elements corresponds to a quarter of the magnetic pole spacing of the code strips. The SIN/COS position dependence of the components of the respective magnetic field vector is resolved or interpolated by means of an interpolator.

On the other hand, the applicant also develops and markets a magnetic tape position detection system having a position sensor absolutely measuring the position of a target object, e.g., a magnetic code strip, wherein the code strip is divided into two parallel tracks. One track allows incremental measurements with relatively high-resolution position determination within one magnetic period of the code strip. The other track, on the other hand, carries an absolute positioning code encoded as a non-repeating, regular 12-bit or 14-bit sequence of maximum length.

SUMMARY OF THE INVENTION

The invention is based on the realization that absolutely measuring magnetic position sensors based on magnetic code strips are designed for only a single magnetic pattern, e.g., only a pattern of certain pole width. These systems are therefore not readily adaptable to different magnetic code objects of uniform bit length. The object of the present invention is thus, firstly, to specify a sensor arrangement concerned here which can be used with magnetic code objects having different magnetic patterns in each case.

The aforementioned parallel tracks of an absolute code strip lead to magnetic disturbances of neighbouring magnetic fields, which results in a considerable reduction of the measuring resolution and in a considerably limited possible reading distance between the code strip and the magnetic sensor elements. The object of the present invention is therefore also to specify a sensor arrangement concerned here which enables a greater reading distance.

The aforementioned inherently known absolute sensors are very sensitive to misalignments of the sensor elements relative to the code strips. The object of the present invention is thus also to specify a sensor arrangement concerned here which is as fault-tolerant as possible with respect to such misalignments.

Errors occurring in the code strips, e.g., due to mechanical wear or due to changes in magnetization, such as undesired reversal of magnetism of individual magnetic poles, lead to a reduction in the measurement resolution or even render the entire position detection system unusable. The object of the present invention is therefore also to specify a sensor arrangement concerned here which can also be adapted to such changes in the respective magnetically encoded measurement object.

In sensor applications with a circularly curved code strip, it must always be ensured that the circumference of the respective code strip is an integral multiple of the respective bit width. It is therefore also an object of the present invention to specify a sensor arrangement concerned here which is compatible with any diameter of such a code strip.

According to a first aspect, the invention proposes, in particular for solving the aforementioned objects, an absolute measuring linear position sensor system having a substantially linear arrangement of a plurality of magnetic field sensors and having a single and single-track absolute measuring magnetic code strip or tape having a uniform bit length of the binary patterns or bit patterns encoded on the code strip.

In accordance with another aspect of the invention, the magnetic field sensors can form a high spatial resolution arrangement of sensor elements magnetically detecting in at least two spatial directions.

In accordance with another aspect of the invention, the magnetic field sensors can be arranged in a substantially linear manner with spacings varying with respect to each other in each case.

In the present context, a so-called "magnetic code" represents a magnetic bit sequence, wherein longitudinally arranged zones of substantially equal bit length correspond to bits of the bit sequence, and the direction of magnetization of each zone is determined by the value of the corresponding bit. Such zones of substantially equal bit length are referred to herein as "magnetic bits". The zones themselves are substantially magnetically homogenously polarized, wherein the polarization direction is perpendicular to the surface of the code tape, and wherein the polarization of the zones is of substantially equal strength, but in opposite directions for binary '0' and '1' values respectively.

A "bitmap" in the present context is a bit sequence stored in the memory of the sensor device to represent binary values corresponding to the respective bit sequence of said magnetic bits of the code tape.

According to another aspect of the invention, a said position detection system identifies the values of the magnetic bits in the range of their length, i.e., in the manner of a correspondingly detected bit sequence, and determines the position of each 0→1 and 1→0 bit transition along the longitudinal axis of the code tape, with respect to the coordinate system of the sensor arrangement. The position of said bit transitions can occur with an accuracy of better than ¼ bit length of a magnetic bit.

According to a yet another aspect, the position detection system determines the initial longitudinal positions of the magnetic bits of the respective code object (e.g., stretched or straight or curved code tape), with respect to the coordinate system of the sensor arrangement. The accuracy possible is thereby better than ¼ of the width of the magnetic bit.

The position detection system, according to yet another aspect, locates the bit sequence detected at the code object in a said bitmap and calculates therefrom the rough absolute position of the sensor arrangement along the code object as a mathematical product of the magnetic bit width and the sequence number of the respective first bit of the observed sequence within the bitmap.

The position detection system, according to yet another aspect, calculates the absolute position from the bit sequence detected at the code object as the sum of the rough absolute position and the starting position of the first bit of the observed bit sequence in the coordinate system of the sensor arrangement.

The position detection system, according to yet another aspect, has a learning mode and a normal mode, wherein the learning mode can be activated in the normal mode of the position detection system.

The sensor arrangement according to the invention or a corresponding position detection system has in particular the following technical effects or advantages resulting therefrom:
- the sensor arrangement or the position detection system can be used with a plurality of absolute as well as incremental magnetic code strips or tapes with the advantages described herein;
- the relatively low complexity of an electronic measuring or evaluation system processing the sensor data allows considerable cost savings;
- the sensor arrangement and the position detection system are relatively reliable and very robust against external conditions or influences, despite the minor losses in measurement accuracy;
- the sensor arrangement enables the development of self-adaptive sensors and so-called "cyber-physical" length or position measuring systems;
- the position detection system is capable of learning due to the measuring method proposed according to the invention;
- the sensor arrangement enables a fully autonomous operation of a position detection system concerned here.

BRIEF DESCRIPTION OF THE DRAWINGS

Other objects and features of the invention will become apparent from the following detailed description considered in connection with the accompanying drawings. It is to be understood, however, that the drawings are designed as an illustration only and not as a definition of the limits of the invention.

In the drawings.

DETAILED DESCRIPTION OF PREFERRED EMBODIMENTS

Figure 1:
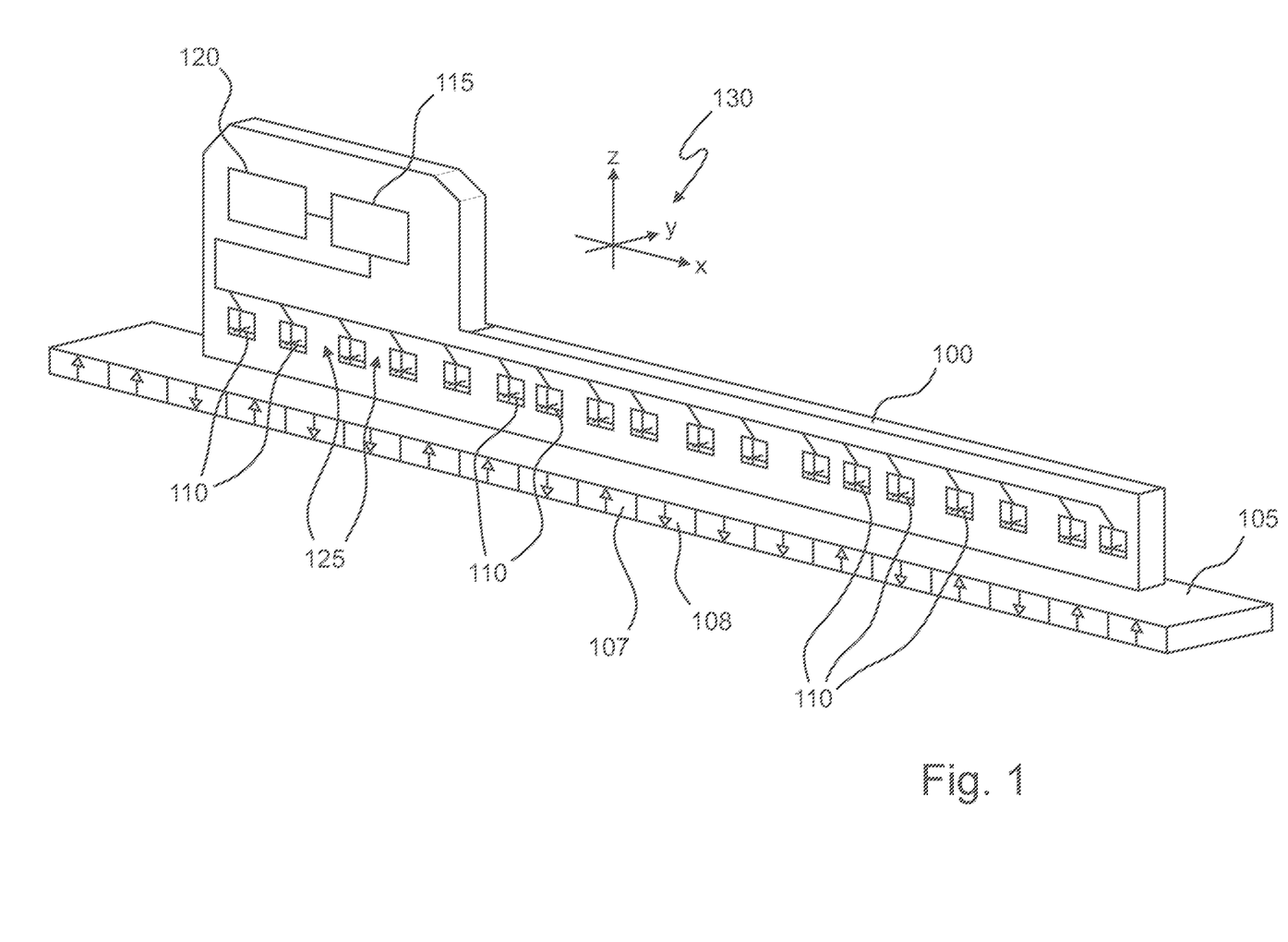
FIG. 1 shows a position detection system according to the invention in a schematic, isometric depiction.

The sensor arrangement (or sensor head) 100 shown in FIG. 1 and the magnetic target object shown there, in the present case a stretched magnetic code tape 105, together form a linear, absolute measuring position detection system.

The magnetic code tape 105 has a plurality of magnetic poles, with either the pole direction upwards 107 or the pole direction downwards 108. The linear arrangement of these different poles in the x-direction represents the encoding of the magnetic code tape 105.

The sensor arrangement or sensor head 100 has plurality of, in the present exemplary embodiment, eighteen (18) magnetic field sensor elements 110, which are irregularly spaced in the x-direction as indicated by the arrows 125. The sensor head 100 also includes a measurement unit and digital signal processing unit (DSP unit) 115 and a digital communication interface 120.

Additionally, the typical spatial arrangement of the axes of a coordinate system 130 of the sensor arrangement 100 with respect to the magnetic code tape 105 provided in the present exemplary embodiment is marked.

The measurement unit/DSP unit 115 arranged on the sensor arrangement or the sensor head 100 in the present exemplary embodiment detects and processes the raw signals from the magnetic field sensor elements 110 and communicates with external devices (not shown here) via a digital communication interface 120, namely for transmitting sensor data, parameter data and diagnostic data. In the present exemplary embodiment, the magnetic field sensor elements 110 are designed to be magnetically sensitive in two axes in order to be able to perform a phase evaluation of the measurement signals as mentioned and described in more detail below.

The magnetic field sensor elements 110 have in particular the following technical properties or features:
- they are designed to be substantially equal;
- they are arranged in the direction of movement of the sensor elements along the magnetic code object;
- depending on the spatial configuration of the code object or the movement trajectory of the respective target object to be detected, they are arranged either along a straight line or along a curved trajectory;
- they are arranged either with a substantially constant distance between the individual sensor elements or with different or varying distances between the individual sensor elements as shown in FIG. 1;
- they each have at least two sensitive axes for detecting the magnetic field generated by the magnetic target object. The sensitive axes thereby span a plane substantially coinciding both with the arrangement of the magnetic field sensor elements and with a line connecting the arrangement of the magnetic field sensor elements and the centre of the respective magnetic target object. Said centre is either the centreline of a magnetic code tape or the centre of a discrete magnet, depending on the type of target object.

However, the sensor arrangement proposed herein can also be applied to sensor elements which detect magnetically only in a single axis. The sensor arrangement can (optionally) also still have a third, sensitive axis oriented substantially perpendicularly to the first two axes.

In particular, the signal processing unit 115 has the following technical properties or features:

- it has a programmable component, e.g., a microcontroller, an FPGA or similar, or a combination of such components, as well as an operational memory, e.g. an RAM, which is as fast as possible, and a rewritable, non-volatile memory, e.g. a FLASH, FRAM or similar;
- it cyclically reads out the signals from the magnetic field sensor elements;
- it converts the sensed signals into a series of regular sensor signals in a self-regulating manner, so to speak, by eliminating small sensory differences between the magnetic field sensor elements of the sensor arrangement by means of a background correction and by means of a gain compensation, e.g., on the basis of a spatial rotation of the rectified signals with respect to the coordinate system of the sensor arrangement;
- it determines, based on the detected sensor signals, the relative position of the sensor arrangement or sensor head with respect to the magnetic target object;
- it provides diagnostic information and tools for installation, maintenance and normal operation of the position detection system;
- it is capable of communicating bidirectionally with external devices via a digital interface.

Figure 2A:
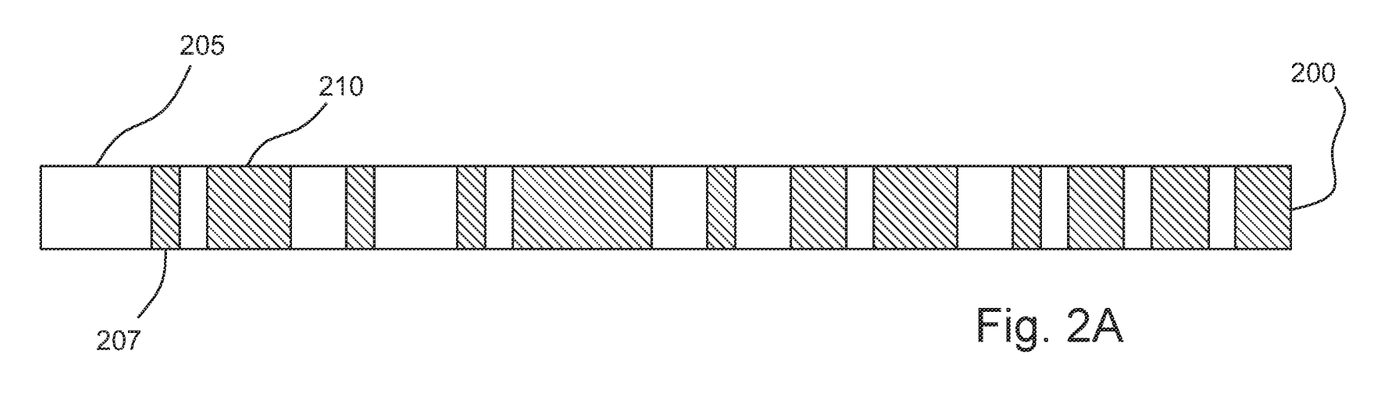
FIGS. 2A, 2B schematically show two possible designs of a magnetic code tape or strip concerned here.
Figure 2B:
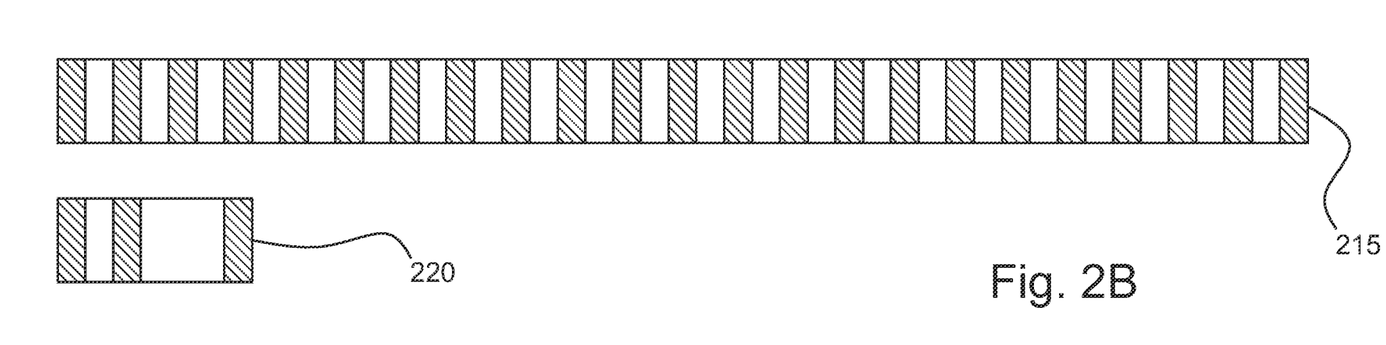

FIGS. 2A and 2B schematically show two exemplary magnetic code tapes (or magnetic code strips) of a position detection system concerned here.

The absolute code tape shown in FIG. 2A has only a single track 200 having an absolute code having a uniform bit length. The absolute code is composed of a linear arrangement of poles with pole direction (see FIG. 1) upwards 205 as well as with pole direction downwards 210. Thus, the coding shown comprises both single poles 207 surrounded by poles of different polarity and multiple poles, i.e., multiple connected poles of the same polarity 205, 210.

In contrast, the code tape shown in FIG. 2B, which is also suitable for the sensor arrangement according to the invention or a corresponding position detection system, has both a uniform, incremental bit length code 215 and a relatively short code segment 220 or a corresponding code target object having a bit code also of uniform bit length in each case.

According to FIGS. 2A and 2B, only a single absolute code track 200, 220 is required in each case according to the invention. This has various advantages with respect to the magnetic code strip. First, it results in lower manufacturing costs and also total operating costs compared to prior art. In addition, there is a simpler installation as well as greater tolerances to assembly inaccuracies.

Figure 3:
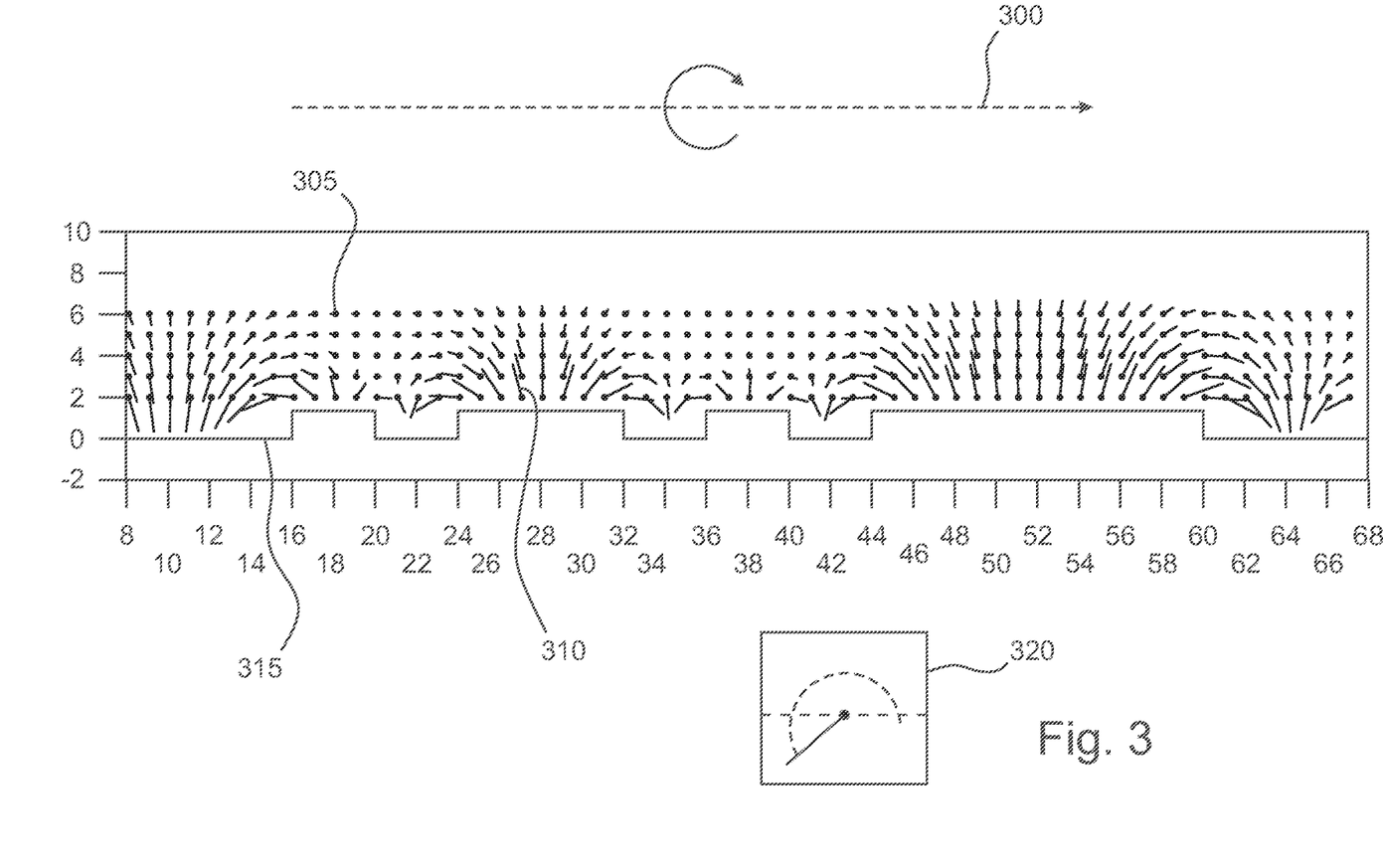
FIG. 3 shows typical changes in the magnetic field vector when moving along a code tape shown in FIG. 2A by means of a sensor arrangement according to the invention, on the basis of which a phase evaluation is carried out.

FIG. 3 illustrates the magnetic field vector resulting when moving along a code strip shown in FIGS. 2A and 2B in the x-direction 300 by a sensor arrangement according to the invention. The points 305 included in the diagram indicate the respective position of the scanning. The lines 310 also shown there are in each case aligned in the direction of the field vectors occurring during magnetic induction, corresponding to the possible phase values 320 indicated below the diagram. The length of the lines has been normalized to the maximum of the absolute field values present.

The step-shaped line 315 drawn in the lower part of the diagram corresponds to the magnetic code resulting from the scanning. The angle of the magnetic induction vectors is measured with respect to the x-axis. In the following, this angle is referred to as the phase angle or phase of the magnetic induction vectors.

At any distance of the sensor elements from the respective code tape (namely in the vertical z-direction shown in FIG. 1), wherein this distance should not be greater than approximately the longitudinal dimension of a magnetic code bit, the magnetic induction vector rotates in a negative direction when the sensor elements move from left to right, i.e., clockwise in the present representation. Above code bit boundaries with alternating (bit) polarity, the field is substantially horizontal. At greater distances, however, certain bits are difficult or impossible to detect or measure due to the broadening of the magnetic field distribution of the individual magnetic code bits (see the bits contained in the top line).

Figure 4A:
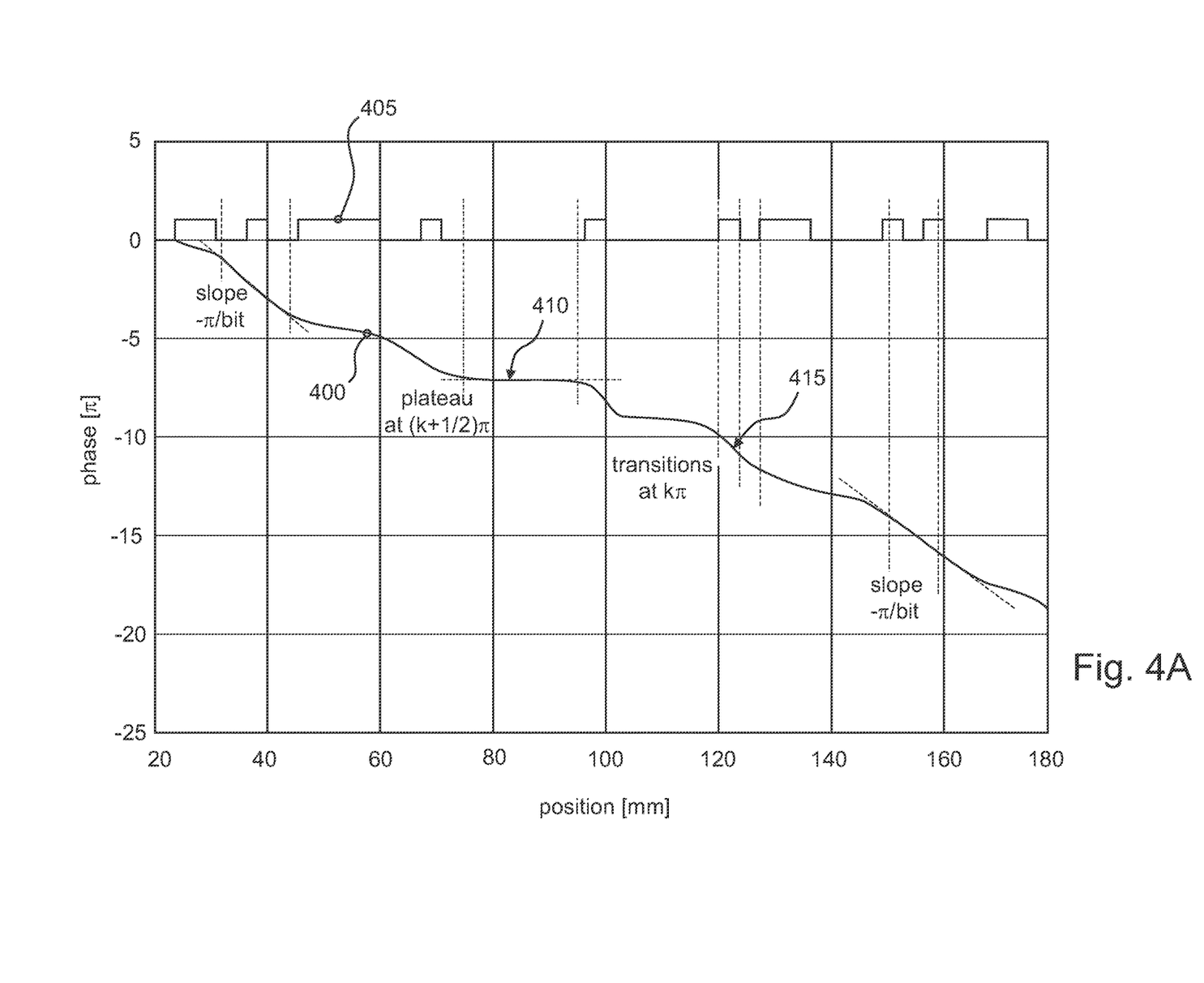
FIGS. 4A, 4B show typical measurement curves obtained with a sensor arrangement according to the invention with phase transitions shown in FIG. 3, namely corresponding position data (4A) and bit patterns (4B) recognized from these measurement curves.

FIG. 4A illustrates typical measurement curves for the phase transitions at the code bits detected in each case. Here, the curved line 400 corresponds to the phase progression of the magnetic induction vector along the (horizontal) position on the code tape and the step-shaped line 405 corresponds to the corresponding value of detected magnetic code bits.

If the sensor arrangement or the sensor head moves from left to right over the respective target object, e.g., a magnetic code tape, a dipole magnet, or the like, then the magnetic induction vector rotates in a negative direction, i.e., clockwise in the present case. The phase progression 400 now has characteristic features which correspond to the structure of the magnetic code tape. Plateau-shaped phase course areas 410 correspond to longer, magnetically homogenous sections. At magnetic transitions 415 between poles or pole areas of different polarity, however, the respective code bits are inverted. Therefore, it is possible to determine the magnetic bit sequence present in each case by means of a "reverse analysis".

Figure 4B:
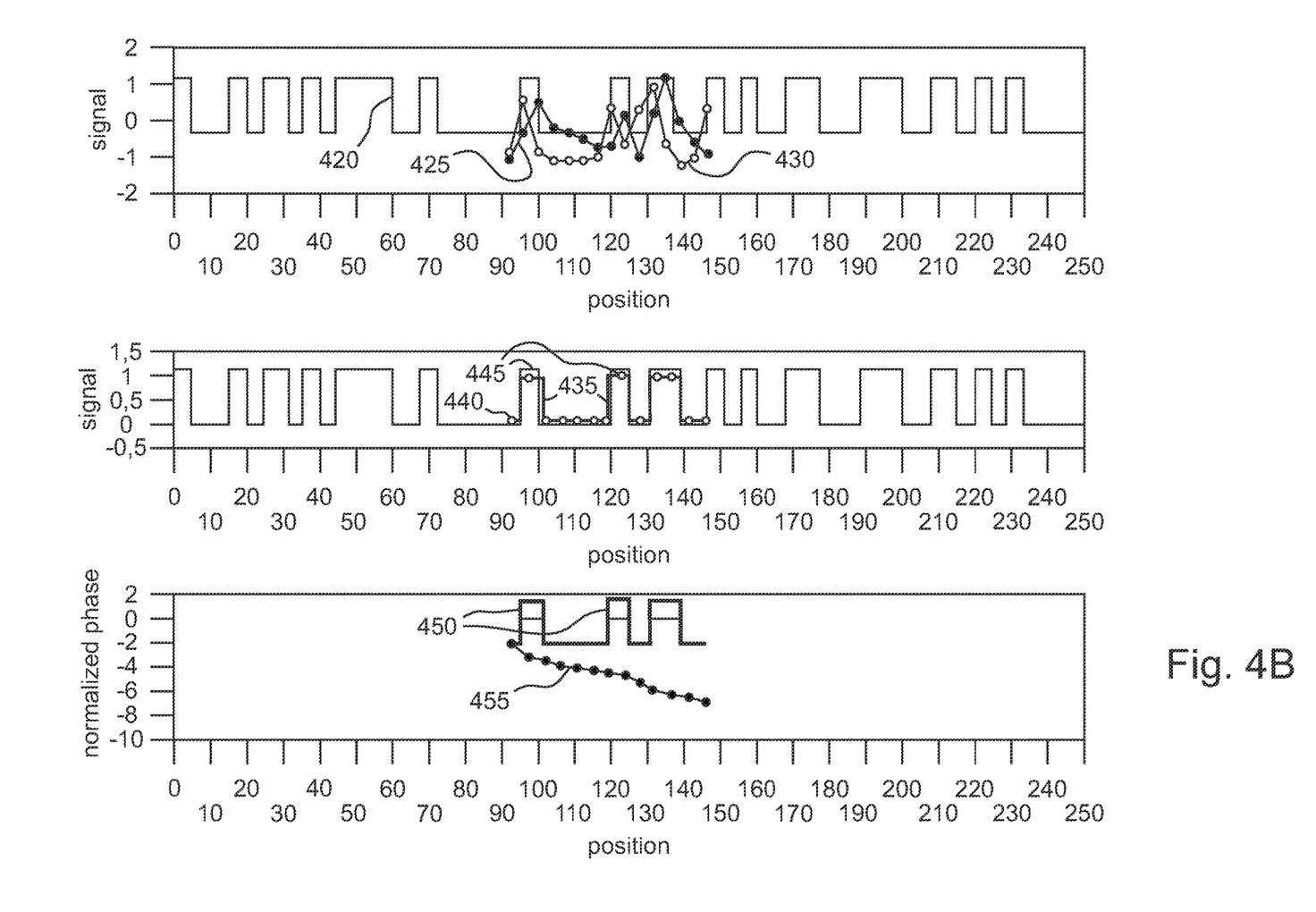

In FIG. 4B, a code tape bit pattern 420 is depicted in the upper part of the diagram shown, wherein 425 and 430 represent the respective x and z components of a corresponding regular (and already rectified) signal detected by sensors. A detected binary pattern 435 is depicted in the middle of the diagram. Here, the points 440 correspond to detected bits and the point 445 to the actual reference position of the sensor. In the lower part of the diagram, a detected bit pattern 450 and a monotonic phase 455 generated from said regular signals detected by sensors are depicted.

Figure 5A:
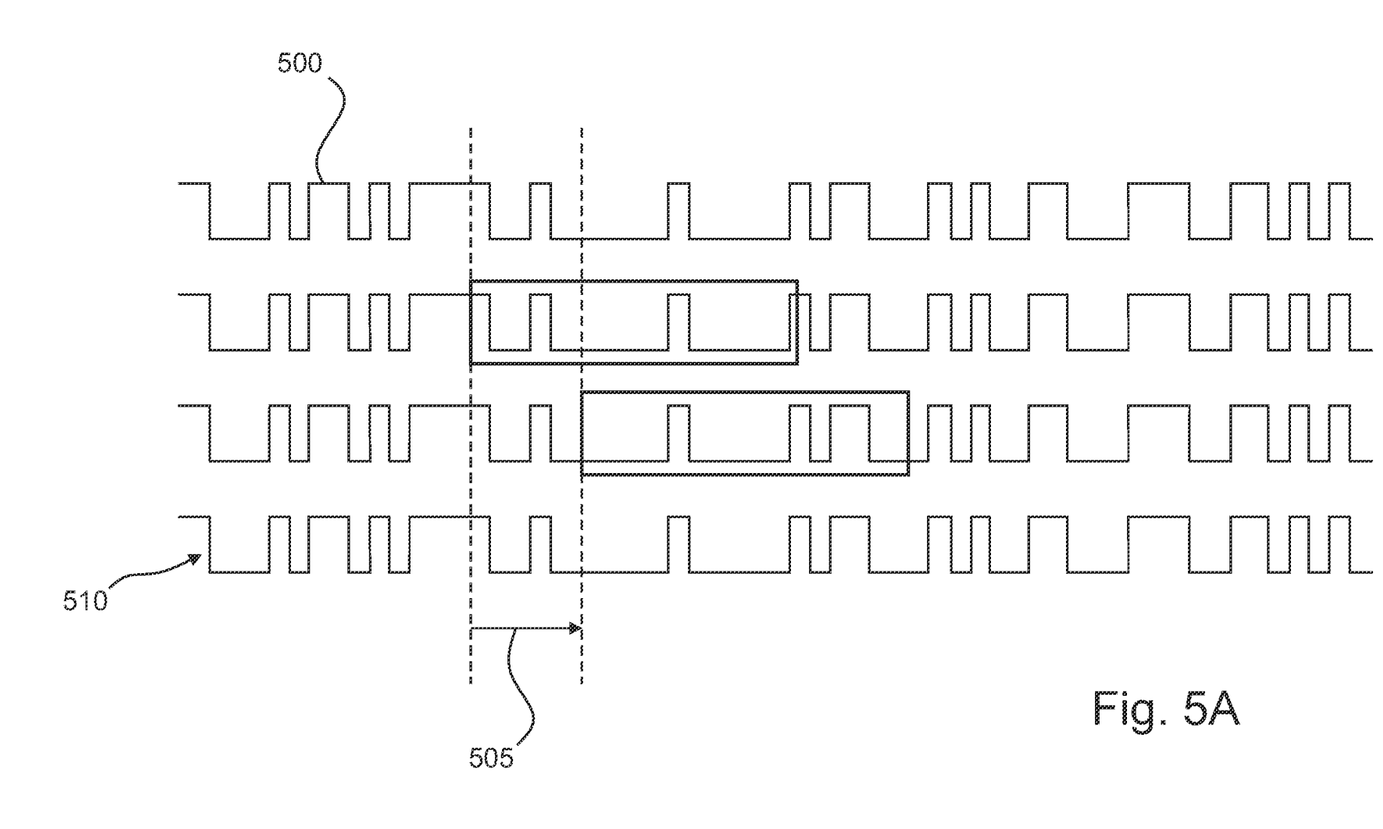
FIGS. 5A, 5B show a learning method according to the invention on the basis of a typical bit sequence (5A) measured on a code tape concerned here and on the basis of a correspondingly learned bit pattern (5B).

FIG. 5A depicts an exemplary magnetic scanning 500 of a code tape, wherein a recognized bit sequence serves as the basis of a learning procedure. The bit sequence learned in this way (or a correspondingly stored value table, bit reference map, or similar) can be continuously expanded or stored during further relative movements 505 between the sensor head and the code tape (see lower step line 510).

The teaching of a mentioned reference map of bit sequences of a magnetically coded target object can be initiated during the first use of the position detection system, e.g., due to a corresponding user input, or in the case that an actually (locally) detected bit sequence cannot be assigned to a bit sequence present within an already learned reference map. In the latter case, a corrected reference map is created until a match between the present reference map and the new map is detected in a sufficiently large area, when the two maps are merged into a single map.

Figure 5B:
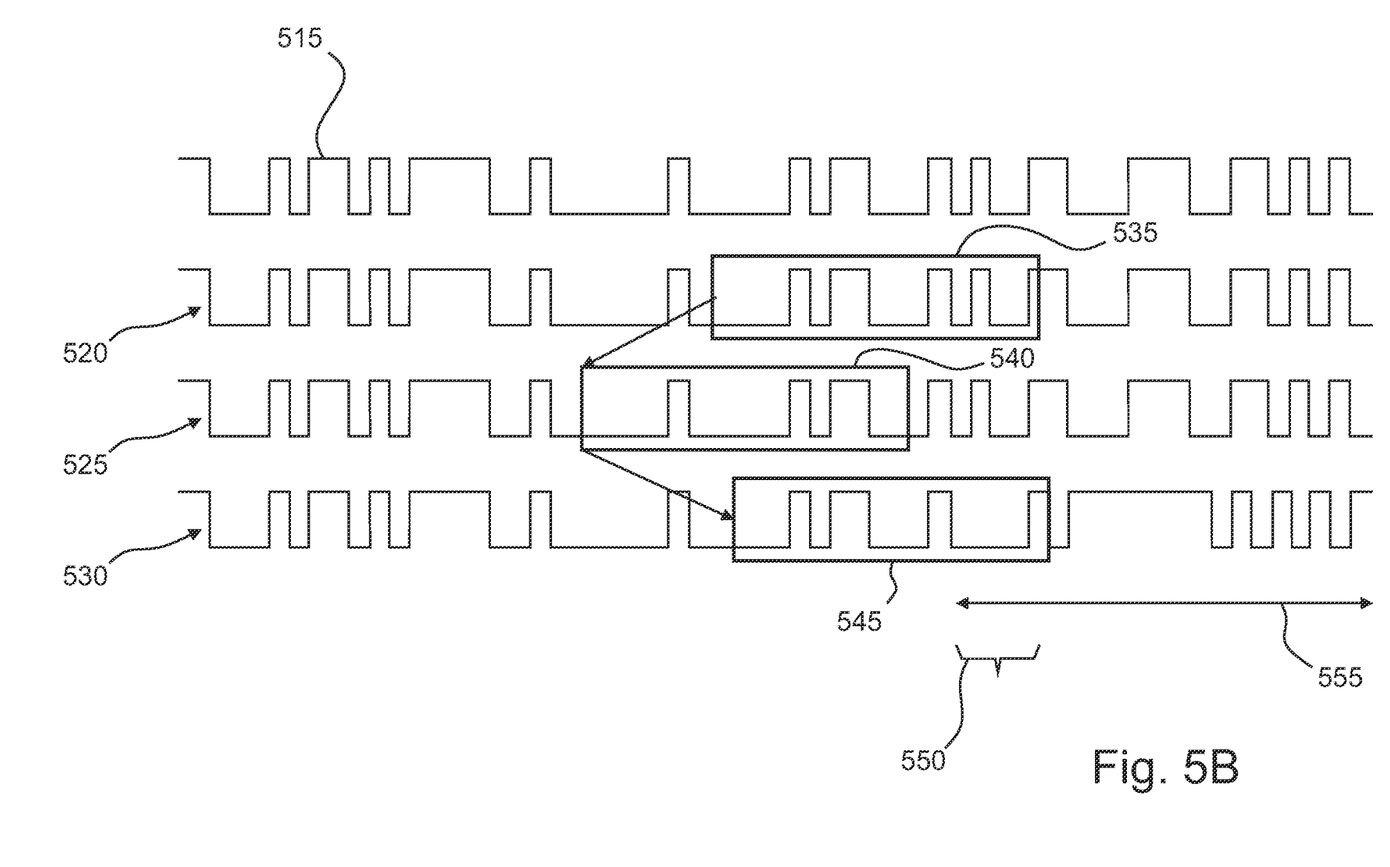

FIG. 5B illustrates the detection of an exemplary change in the magnetically encoded target object shown in FIG. 5A. The first line of the depiction depicts a previously learned bit sequence 515 stored on a reference map. In the lower three lines 520, 525, 530, the procedure when recognising change is shown in greater detail.

As long as the sensor head 100 shown in FIG. 1 moves in an unchanged area of the code tape 105, it operates in normal mode, and the bit patterns 535, 540 detected in the process are readily located on the reference map. If a portion of the code tape 105 is replaced by another portion having a differently encoded bit pattern 555, a bit error will often and systematically occur when the sensor head 100 moves, namely when the sensor head 100 moves into this area.

However, when the bit patterns thus detected contain only a few altered bits 550 at the end in the direction of movement of the sensor head 100, then the bits on the reference map corresponding to the altered portion can be marked as unreliable and thus the position of the sensor head 100 can still be determined with sufficient accuracy. Thus, as the sensor head 100 moves further into the altered region 555, the detected bit pattern will not correspond to any or only a relatively unlikely portion of the reference map.

In order to thereby increase the robustness of the sensor arrangement, it is advantageous to reactivate the aforementioned learning mode even during normal operation of the sensor arrangement, or even to leave it permanently active, in order to already be able to learn the bit patterns encoded in the modified code tape, for example in order to store them on an alternative reference map. This allows the position of the sensor head 100 to be determined based on both the normal reference map and the alternative reference map, in order to recognize or assume a more likely position value as the correct sensor head position in the result. If the position can be determined with greater consistency using the alternative reference map, the normal reference map can then be replaced with the alternative reference map.

In the following, a method for operating a position detection system concerned here is described in more detail.

To generate an aforementioned bit map ("bitmap") or reference map by means of learning, binary values corresponding to the sequence of magnetic bits of the code tape, i.e. the corresponding bit sequence, are stored on the map. The reference map is continuously expanded during operation of the system, based on bit information extracted from magnetic field-related sensor quantities detected as the sensor head moves along the movement region.

The position detection system creates a reference map from the respective observed bit sequence according to the following process steps:
- if the reference map is still empty, a currently detected bit sequence is stored at the beginning of the map;
- the position detection system searches for a previously already detected and stored bit sequence on the reference map;
- if a currently detected bit sequence is found within the reference map, then the reference map remains unchanged;
- if the currently acquired bit sequence, which is truncated at the beginning or at the end, is not shorter than the length of a matching bit sequence found on the reference map, then the bits of the truncated portion of the currently detected bit sequence are attached to the beginning or the end of the reference map. If the new bits are attached to the beginning of the reference map, then these bits are characterised characterized by negative consecutive numbering.

If the truncated bit sequence is not found on the reference map, then a second reference map is created.

The position detection system determines a rough absolute position of the sensor even if a currently detected bit sequence does not completely match any part of the reference map.

The described position detection system has a relatively high fault tolerance.

The position detection system continues to operate even if one or more bits in the scanning area of the sensor arrangement are damaged. Magnetic bits of a code tape can be damaged mechanically or by other external influences, e.g., due to local reversal of magnetism or demagnetization at an elevated temperature. Also, the presence of another ferromagnetic or permanent magnetic object in the vicinity of the code tape can cause some magnetic bits to appear as damaged at least. Such damaged bits can be either (i) inverted or (ii) marked as faulty.

The position detection system continues to operate even if one or more of the sensor elements of the sensor arrangement cease operation or provide unreliable values of the magnetic field components. The system can (i) attempt to recalibrate the affected sensor element or (ii) exclude the sensor element altogether from the evaluation of the sensor data, in particular from the determination of said 0→1 and 1→0 bit transitions and their positions.

The position detection system also maintains the reference map during normal operation. Thus, non-matching bits of the reference map are (i) marked as not reliable, (ii) characterized by the frequency (or probability) of "non-matching", or (iii) inverted in case of systematic occurrence of "non-matching".

The position detection system determines the magnetic bit length independently. For this purpose, during the movement of the sensor head, the system analyzes the positions of the 0→1 and 1→0 bit transitions in its own coordinate system and (i) calculates the respective magnetic bit length or (ii) selects a most suitable one of possible bit length values of a given specification of the respective code tape.

The position detection system independently performs a correction in determining the positions of 0→1 and 1→0 bit transitions, taking into account bits in the vicinity of the bit transition in question.

If the position detection system is unable to determine the rough absolute position, or if a determined absolute position differs systematically and significantly from a next position to be expected, then the system tries again to determine the rough absolute position, e.g., determining a position based on the reverse order of the bit sequence stored on the reference map.

The position detection system also detects an error in the orientation of the sensor head relative to the code object, e.g., an error in its orientation in the y-direction, orientation in the z-direction, rotation about the x-axis (roll), rotation about the y-axis (tilt), and rotation about the z-axis (yaw), and/or its lateral (y) position and/or distance (z) from the code object.

It should be noted that the preferred geometry of the sensor arrangement is a substantially equidistant linear arrangement of the sensor elements. However, a matching distance between respective adjacent elements is not a requirement for reliable operation of a position detection system concerned herein, provided that the evaluation method of the signals detected by sensors with respect to a bit sequence to be detected also allows for a non-equidistant sensor arrangement.

It should further be noted that the distance between the centres of adjacent sensor elements of the sensor head can be set as follows, namely greater than:

(i) the magnetic bit length,
(ii) 1.5 times the magnetic bit length,
(iii) 1.65 times the magnetic bit length etc. as long as the essential monotony of the field vector rotation angles for the arrangement of the sensor element can be maintained.

Although only a few embodiments of the present invention have been shown and described, it is to be understood that many changes and modifications may be made thereunto without departing from the spirit and scope of the invention.

What is claimed is:

1. An absolutely measuring position detection system based on a magnetic code object (105), comprising a sensor arrangement (100) with a substantially linear arrangement of a plurality of magnetic field sensors (110),
   wherein a bit pattern (107, 108) encoded on a single-track magnetic code object having a uniform bit length is readable by means of the magnetic field sensors,
   wherein the values of magnetic bits are detected in the range of a detected bit sequence and wherein the position of each 0→1 and 1→0 bit transition along a longitudinal axis of a code object (105) is determined from the detected bit values,
   wherein the magnetic bit sequence of the code object (105) is determined by phase evaluation,
   wherein the phase progression (400) comprises characteristic features at respectively detected code bits of the code object (105), which correspond to the structure of the magnetic code tape,
   wherein plateau-shaped areas (410) of the phase curve (400) are assigned to longer, magnetically homogenous sections, and
   wherein magnetic bits detected at magnetic transitions (415) between pole regions of different polarity of the magnetic code object (105) are inverted.

2. The absolutely measuring position detection system according to claim 1, wherein the initial longitudinal positions of the magnetic bits of the code objects (105), relative to a predetermined coordinate system (130) of the sensor arrangement (100), are determined.

3. The absolutely measuring position detection system according to claim 1, wherein a bit sequence detected at the code object (105) is identified in an existing reference map (bitmap) and a rough absolute position of the sensor arrangement (100) along the code object (105) is determined therefrom.

4. The absolutely measuring position detection system according to claim 3, wherein the rough absolute position is calculated as the mathematical product of the magnetic bit width and the sequence number of the respective first bit of the observed sequence within the reference map.

5. The absolutely measuring position detection system according to claim 3, wherein the absolute position is calculated from the magnetic bit sequence detected at the code object as the sum of the rough absolute position and the start position of the first bit of the magnetic bit sequence detected at the code object.

6. The absolutely measuring position detection system according to claim 3, wherein the reference map is created or continued by means of a learning method.

7. The absolutely measuring position detection system according to claim 6, wherein, in the learning method, a learned bit sequence (515) is continuously extended or stored (510) during further relative movements (505) between the sensor head (100) and the code object (105).

8. The absolutely measuring position detection system according to claim 6, wherein bit values detected in the learning method are stored on the reference map according to the sequence of magnetic bits of the code object (105).

* * * * *